(12) United States Patent
Frank et al.

(10) Patent No.: US 10,502,162 B2
(45) Date of Patent: Dec. 10, 2019

(54) DIELECTRIC SEAL DEVICE

(71) Applicant: Rohr, Inc., Chula Vista, CA (US)

(72) Inventors: Joel H. Frank, La Jolla, CA (US); Lubomir A. Ribarov, West Hartford, CT (US)

(73) Assignee: ROHR, INC., Chula Vista, CA (US)

( * ) Notice: Subject to any disclaimer, the term of this patent is extended or adjusted under 35 U.S.C. 154(b) by 1020 days.

(21) Appl. No.: 14/964,363

(22) Filed: Dec. 9, 2015

(65) Prior Publication Data

US 2017/0167441 A1  Jun. 15, 2017

(51) Int. Cl.
*F02K 1/80* (2006.01)
*F16J 15/02* (2006.01)
*F02K 1/09* (2006.01)

(52) U.S. Cl.
CPC ............... *F02K 1/805* (2013.01); *F02K 1/09* (2013.01); *F16J 15/022* (2013.01); *F05D 2240/55* (2013.01)

(58) Field of Classification Search
CPC .......... F02K 1/805; F02K 1/09; F16J 15/022; F05D 2240/55
USPC ........................................................ 277/345
See application file for complete search history.

(56) References Cited

U.S. PATENT DOCUMENTS

| | | | |
|---|---|---|---|
| 5,313,788 A | 5/1994 | Wright et al. | |
| 5,706,648 A | 1/1998 | Porte et al. | |
| 5,778,659 A | 7/1998 | Duesler et al. | |
| 8,240,677 B2 * | 8/2012 | Browne | B60J 10/50 277/628 |
| 8,987,948 B2 | 3/2015 | Simper et al. | |
| 9,103,298 B2 | 8/2015 | Gormley | |
| 2006/0170243 A1 * | 8/2006 | Browne | B29C 33/308 296/146.9 |
| 2009/0255187 A1 * | 10/2009 | Alexander | B60J 10/244 49/477.1 |
| 2015/0044018 A1 * | 2/2015 | Dierksmeier | F01D 11/001 415/1 |

OTHER PUBLICATIONS

Pelrine, R. et al. "High-Speed Electrically Actuated Elastomers with Strain Greater Than 100%", www.sciencemag.org, vol. 287, Feb. 4, 2000, 5 pages.

(Continued)

*Primary Examiner* — Nathan Cumar
(74) *Attorney, Agent, or Firm* — Cantor Colburn LLP (57) ABSTRACT

A seal device that may be for a variable area fan nozzle (VAFN) assembly of a turbofan engine is positioned between first and second surfaces configured to move between close and distant positions. The seal device includes a first electrode engaged to the first surface and a second electrode spaced between the first and second surfaces and spaced from the first electrode. A resilient first element of the device is disposed between and engages to the first and second electrodes, and is configured to move between contracted and expanded states when the electrodes are energized. A resilient second element of the device opposes the second surface and is engaged to the second electrode. The second element is configured to move between a compressed mode when the first and second surfaces are in the close position and an extended mode when the first and second surfaces are in the distant position.

12 Claims, 4 Drawing Sheets

(56) References Cited

OTHER PUBLICATIONS

Zhao, Z. et al. "Theory of Dielectric Elastomers Capable of Giant Deformation of Actuation", Physical Review Letters, The American Physical Society, School of Engineering and Applied Sciences, Harvard University, Cambridge, Massachusetts 02138, PRL 104, 178302 (2010), 4 pages.

Suo, Z., Theory of Dielectric Elastomers, School of Engineering and Applied Science, Kavli Institute for Nanobio Science and Technology, Harvard University, Cambridge, MA, Oct. 25, 2010, p. 1-55.

* cited by examiner

DIELECTRIC SEAL DEVICE

BACKGROUND

The present disclosure relates to a seal device and more particularly to a dielectric seal device.

Selectively sealing between two structures capable of movement between multiple states may be achieved through various sealing devices including passive and active devices. More specifically, a sealing relationship between two structures may be desirable when the structures are in a first state, but not a second state. Moreover, sealing may, or may not, be desirable between the two structures when the structures are moving between states. Known sealing devices, however, may create unwanted forces that resist motion as the two structures move between states. Moreover, the movement of the structures may cause excessive wear upon the seal device. Improvement in seal devices for particular applications is desirable.

SUMMARY

A seal device positioned between first and second surfaces configured to move between close and distant positions, the dielectric seal device including a first electrode engaged to the first surface; a second electrode spaced between the first and second surfaces and spaced from the first electrode; a resilient first element disposed between and engaged to the first and second electrodes, and configured to move between contracted and expanded states when the first and second electrodes are energized; and a resilient second element opposing the second surface and engaged to the second electrode, and configured to move between a compressed mode when the first and second surfaces are in the close position and an extended mode when the first and second surfaces are in the distant position.

Additionally to the foregoing embodiment, the first surface is stationary.

In the alternative or additionally thereto, in the foregoing embodiment, the first element is configured to be in the contracted state when the first and second electrodes are energized and in the expanded state when the first and second electrodes are de-energized.

In the alternative or additionally thereto, in the foregoing embodiment, the second element is in the compressed mode when the first element is in the expanded state.

In the alternative or additionally thereto, in the foregoing embodiment, the second element is in the extended mode when the first element is in the contracted state.

In the alternative or additionally thereto, in the foregoing embodiment, the seal device includes a controller configured to energize the first and second electrodes when the first and second surfaces are in the distant position and de-energize the first and second electrodes when the first and second surfaces are in the close position.

In the alternative or additionally thereto, in the foregoing embodiment, the second element is in contact with the second surface when the first and second surfaces are in the close position and the first element is in the extended state.

In the alternative or additionally thereto, in the foregoing embodiment, a cavity is defined by the second element and the second electrode.

In the alternative or additionally thereto, in the foregoing embodiment, an opening in the second element is in fluid communication with the cavity.

In the alternative or additionally thereto, in the foregoing embodiment, the first and second elements are one unitary piece and the second electrode is embedded in the one unitary piece.

In the alternative or additionally thereto, in the foregoing embodiment, the second element includes a contoured face that opposes and mirrors the second surface which is contoured.

In the alternative or additionally thereto, in the foregoing embodiment, the second electrode is contoured to generally match the contoured face.

In the alternative or additionally thereto, in the foregoing embodiment, the dielectric seal device is part of a nacelle of a turbofan engine.

A variable area fan nozzle (VAFN) assembly of a turbofan engine according to another, non-limiting, embodiment includes a fixed structure including a first surface; a translating fan nozzle configured to move between a stowed state and a deployed state, the translating fan nozzle including a second surface sealed to the first surface when the translating fan nozzle is in the stowed state and spaced from the first surface when the translating fan nozzle is in the deployed state; and a seal device disposed between the first and second surfaces for sealing the surfaces together when the VAFN assembly is in the stowed state, and wherein the seal device includes a dielectric elastomer configured to expand and contract upon application of electric power.

Additionally to the foregoing embodiment, the dielectric seal device includes a first electrode engaged to the first surface, a second electrode spaced between the first and second surfaces and spaced from the first electrode, a resilient first element having the dielectric elastomer and disposed between and engaged to the first and second electrodes, and configured to move between contracted and expanded states when the first and second electrodes are energized, and a resilient second element opposing the second surface and engaged to the second electrode, and configured to move between a compressed mode when the translating fan nozzle is in the stowed state and an extended mode when the translating fan nozzle is in the deployed state.

In the alternative or additionally thereto, in the foregoing embodiment, the dielectric seal device includes a controller configured to de-energize the first and second electrodes placing the first element in the expanded state after the translating fan nozzle moves from the deployed state and into the stowed state.

A method of operating a seal device constructed and arranged to disengagably seal to a surface according to another, non-limiting, embodiment includes placing a first element of the seal device in an expanded state when the surface is in a first state by placing or removing an electric potential across the first element; placing a second element into a resiliently biased compressed mode when the first element is in the expanded state and the surface is in the first state; placing the first element in a contracted state by removing or placing the electric potential across the first element; placing the second element into an extended mode by placing the first element into the contracted state; creating a gap between the second element and the surface when in the first state; and moving the surface from the first state and into a second state.

Additionally to the foregoing embodiment, an electric potential is across the first element when in the expanded state and the electric potential is removed from the first element when in the contracted state.

In the alternative or additionally thereto, in the foregoing embodiment, the method includes moving the surface from the second state and into the first state; moving the first element from the contracted state and into the expanded state; moving the second element from the extended mode and into the compressed mode; and sealing the second element to the surface.

In the alternative or additionally thereto, in the foregoing embodiment, the surface moves transversely with respect to the seal device.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
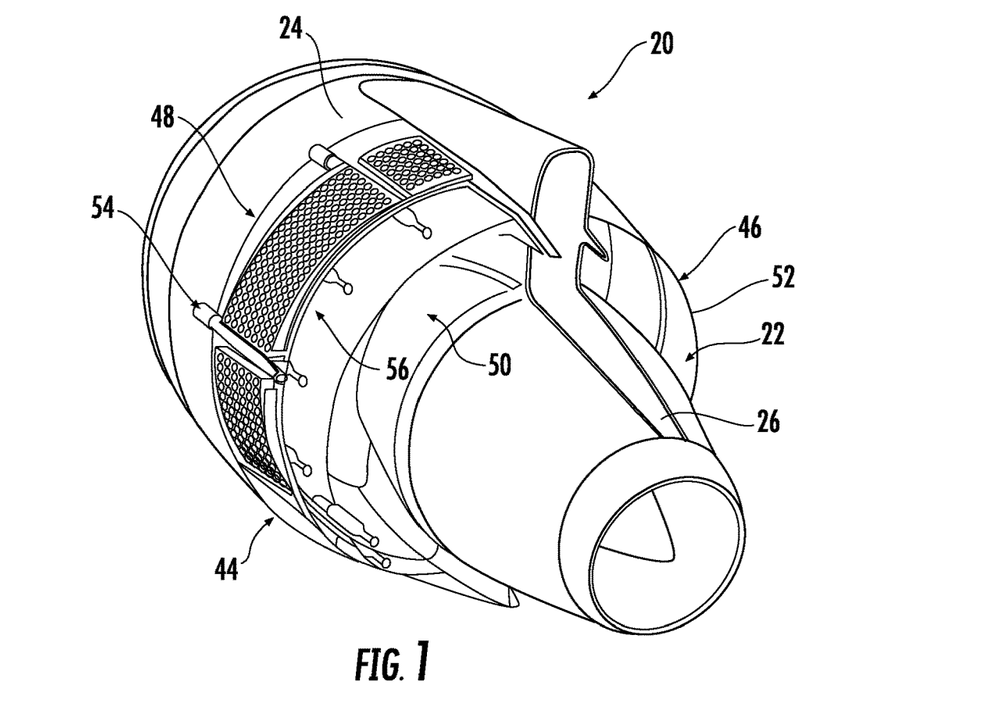
FIG. 1 is a perspective view of a turbofan engine as one, non-limiting, application of the present disclosure.
Figure 2:
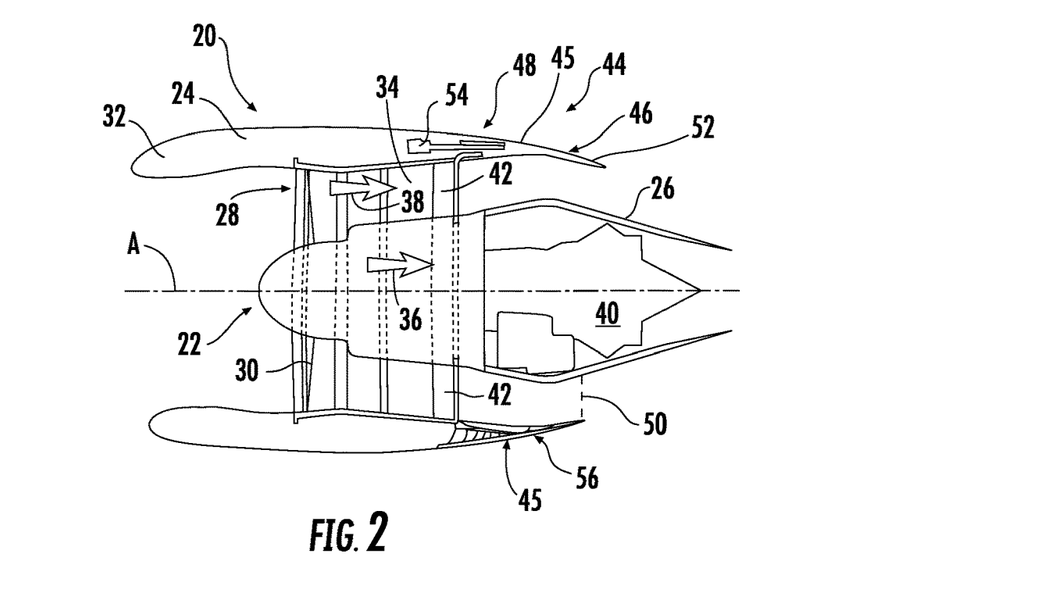
FIG. 2 is cross section of the turbofan engine.

Referring to FIGS. 1 and 2, a turbofan engine 20 includes an engine core 22 and a nacelle 24. The engine core 22 may be housed in a core cowl 26. A fan 28 may be mounted adjacent to an upstream end of the nacelle 24, and may include a series of fan blades 30 that rotate about an engine axis A during engine operation so as to draw a flow of air into an inlet end 32 of the turbofan engine 20. An annular bypass duct 34 is defined between the engine core 22 and the nacelle 24. The airflow drawn into the engine 20 is accelerated and compressed by the rotating fan blades 30.

The engine airflow is generally divided into a core airflow (see arrow 36 in FIG. 2) and a bypass airflow (see arrow 38). The core airflow is directed into and through a multi-stage compressor (not shown) within the engine core 22. The core airflow is initially passed through the compressor to increase the airflow pressure, and then the pressurized core airflow is passed through a combustor (not shown), where the air is mixed with fuel and the mixture ignited. The combustion of the fuel-and-air mixture within the combustor causes the air to expand, which in-turn drives a series of turbine stages 40 located toward the rear of the engine 20, to rotate and in-turn provide power to the multi-stage compressor (not shown) and the fan 28.

The bypass airflow 38, accelerated by the rotating fan blades 30, passes through the bypass duct 34, through a plurality of stators 42, and out through a variable area fan nozzle (VAFN) assembly 44. The fan 28 produces a substantial portion of the engine thrust. The core airflow 36 (as a heated exhaust gas from the combustion of the fuel-and-air mixture) is directed out of the rear of the engine core 22 downstream of the turbine stages 40.

The VAFN assembly 44 includes a fixed structure 45 and a translating fan nozzle 46 configured to be selectively adjusted, for example, as the turbofan engine 20 operates under different flight conditions for optimizing engine performance. The fixed structure 45 may be generally ring-like, circumscribe at least a portion of the engine core cowl 26, and thereby defines in-part the bypass duct 34. The fixed structure 45 may project rearward from and may be attached to a trailing end of a thrust reverser 48. At least a portion of the translating fan nozzle 46 may project rearward of the fixed structure 45 and at least a portion of the translating fan nozzle 46 may be disposed radially between the fixed structure 45 and the bypass duct 34. A substantially annular nozzle exit area 50 of the VAFN assembly 44 is defined by and between a trailing edge 52 of the translating fan nozzle 46 and the core cowl 26.

Figure 3:
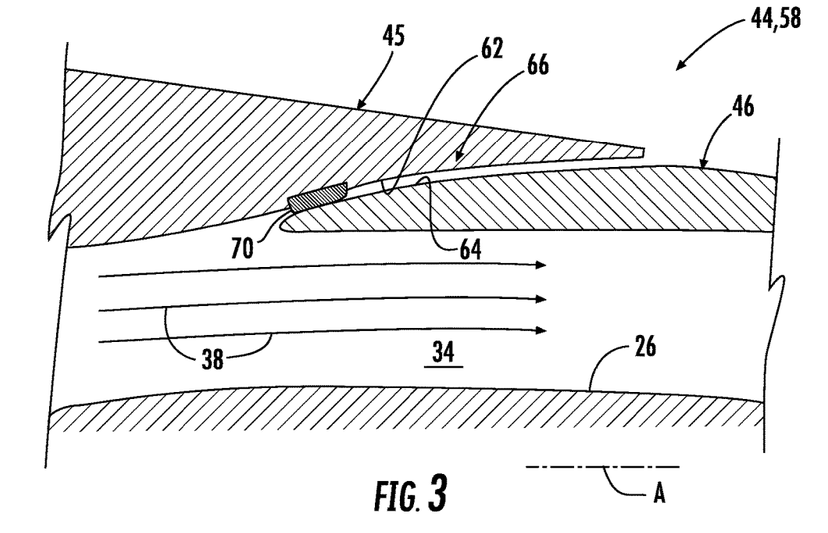
FIG. 3 is a partial cross section of a fan nozzle assembly of the turbofan engine in a stowed state and with electrodes de-energized and the dielectric seal device in an expanded mode.
Figure 4:
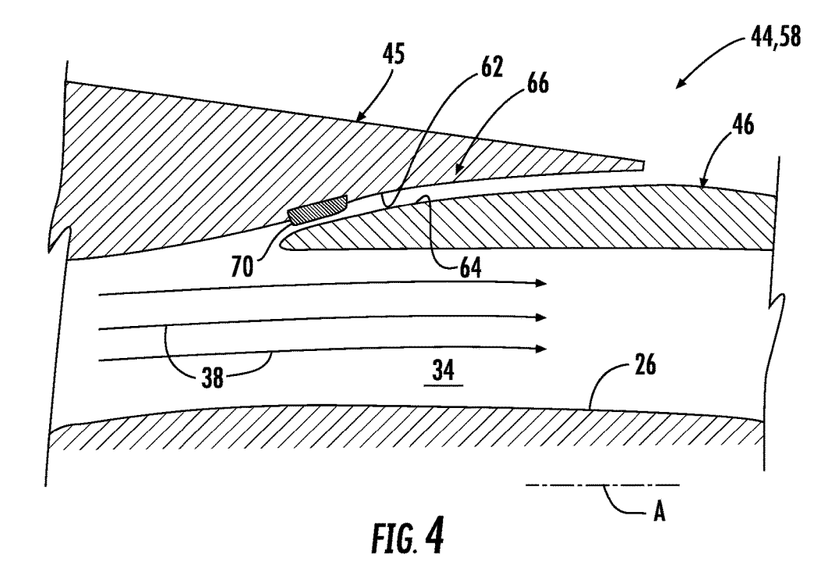
FIG. 4 is a partial cross section of the fan nozzle assembly in the stowed state and with the electrodes energized and the dielectric seal device in a contracted mode.
Figure 5:
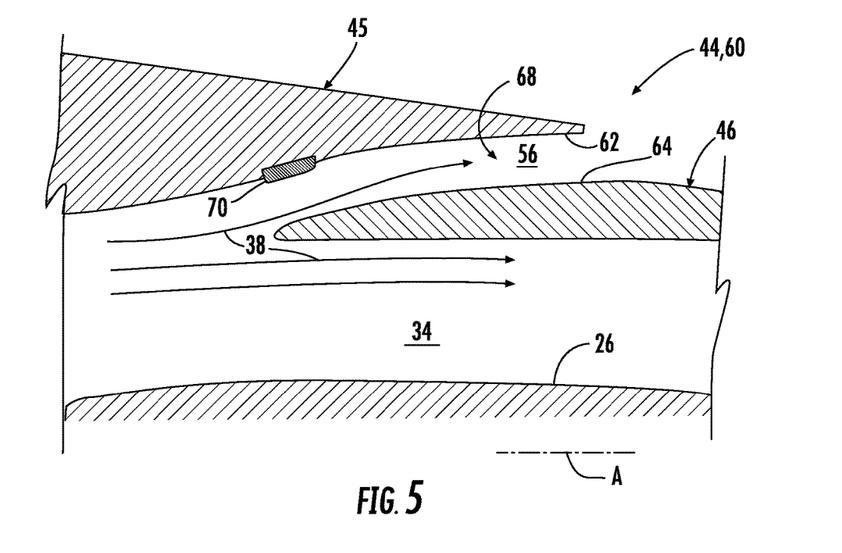
FIG. 5 is a partial cross section of the fan nozzle assembly in a deployed state with the electrodes energized and the dielectric seal device in contracted mode.

Referring to FIGS. 3 and 5, the translating fan nozzle 46 of the VAFN assembly 44 may be selectively translated (i.e., moved fore and aft), via a plurality of circumferentially spaced actuators 54 (see FIG. 1 and FIG. 2), to vary the fan nozzle exit area 50, thus adjusting how much of the bypass airflow 38 exits through an upstream exit 56 (see FIG. 5) formed by the VAFN assembly 44, and which may be substantially annular (see FIG. 1 and FIG. 2). For example, when the translating fan nozzle 46 is in a stowed state 58 (see FIGS. 3 and 4), the upstream exit 56 may be sealably closed and the exit area 50 may be minimized, thereby maximizing a fan pressure ratio (FPR) for a particular operational condition. Also, when the translating fan nozzle 46 is in a fully deployed state 60 (see FIG. 5), the upstream exit 56 flow area (i.e., opening) is maximized and the exit area 50 (see FIG. 2) may be maximized, thereby minimizing the FPR for a particular operational condition. Accordingly, selectively positioning the translating fan nozzle 46 may be used to selectively vary the FPR. Varying the FPR may be used to optimize engine performance, increase fan stall margins, avoid engine malfunction, and/or avoid engine shutdown.

The fixed structure 45 includes a surface 62 that may, as one example, face radially inward and, in-part, axially rearward with respect to axis A. The translating fan nozzle 46 includes a surface 64 that generally opposes the surface 62 of the fixed structure 45 and thus faces radially outward and, in-part, axially forward. Together, the surfaces 62, 64 define the upstream exit area 56 (i.e., when the translating fan nozzle 46 is not in the stowed state 58). As the translating fan nozzle 46 moves from the stowed state 58 to the deployed state 60, the surface 64 of the translating fan nozzle 46 moves away from the surface 62 of the fixed structure, and the upstream exit area 56 becomes increasingly larger. When the surfaces are close together (i.e., the VAFN assembly 44 is in the stowed state 58), the surfaces are in a close position 66, and when a distance between the surfaces is maximized (i.e., the VAFN assembly 44 is in the deployed state 60), the surfaces are in a distant position 68.

An active, dielectric, seal device 70, as one exemplary embodiment of the present disclosure, may be applied to the VAFN assembly 44. The seal device 70 may be generally ring-shaped and is at least in-part disposed between the surface 62 of the fixed structure 45 and the surface 64 of the translating fan nozzle 46 to facilitate a tight seal between the surfaces 62, 64 when the VAFN assembly 44 is in the stowed state 58. Although illustrated in FIGS. 3 through 5 as being part of the VAFN assembly 44, it is further contemplated and understood that the seal device 70 may be applied between any two surfaces of any application having two positional states with one of the states requiring a seal between the surfaces and the other positional state not requiring a seal, and/or where seal wear is of concern.

Figure 6:
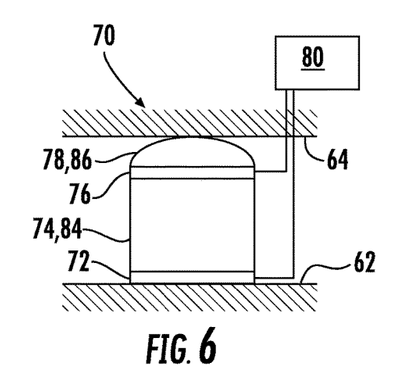
FIG. 6 is a cross section of the dielectric seal device in the expanded mode with electrodes de-energized.
Figure 7:
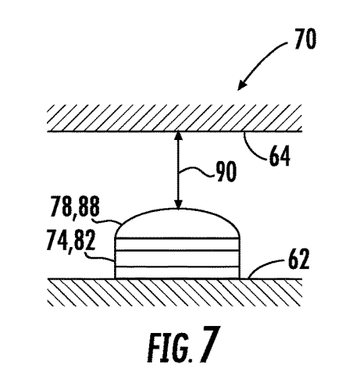
FIG. 7 is a cross section of the dielectric seal device as shown in FIG. 6 in the contracted mode with electrodes energized.

Referring to FIGS. 6 and 7, the dielectric seal device 70 may include a first electrode 72, a resilient first element 74 that may be active, a second electrode 76, and a resilient second element 78 (i.e., cushion) that may be passive. The first electrode 72, in the present example, may be fixed to the surface 62 of the fixed structure 45. The second electrode 76 is spaced outward from the first electrode 72 and the surface 62. The resilient first element 74 is disposed between and engaged to the first and second electrodes 72, 76. The second element is engaged to and projects outward from the second electrode 76 and toward the opposing surface 64 of the translating fan nozzle 46.

The first and second electrodes 72, 76 may include electrical conductors routed to a controller 80 of the seal device 70 configured to produce, for example a voltage potential across the electrodes and through a dielectric material of the resilient first element 74 that further has properties of a dielectric elastomer. A dielectric elastomer, which is publicly known via extensively published research, is a class of flexible electro-active materials known to be capable of very high strains (e.g., more than 20%) when subjected to an electric field between two electrodes. The strain occurs in a Z-direction, which is the direction between the two electrodes. When the electric field is energized, the two surfaces of the dielectric elastomer move closer together, and the shape also spreads out to maintain a constant volume (i.e., the material is generally incompressible). The electrodes may be metal plates, or they may be highly flexible conductive membranes or films like a film of carbon grease.

When the electrodes 72, 76 are energized the first element 74 may be compressed into a contracted state 82 (see FIG. 7) and when the electrodes 72, 76 are de-energized by the controller 80, the first element 74 may re-expand toward its natural or expanded state 84 (see FIG. 6). Typical dielectric materials include, but are not limited to, silicones (e.g., NuSil CF19-2186), acrylics (e.g., VHB 4910, commercially available from 3M®), sheets of graphene, coatings of carbon nanotubes, and others. The first and second electrodes 72, 76 may be electrically connected to the controller 80, or conductor leads extending to the controller, and connected to the first element 74 in any variety of ways. For example, a flexible connector (e.g., wire, coiled metallic sheath, etc.) may be embedded into the soft insulation material of the resilient first element 74. Alternatively, sides of the first and second electrodes 72, 76 may be covered with electro-conductive (e.g., graphite) paste being in contact with the first element 74. It is further contemplated and understood that other means of connecting electrodes to a dielectric elastomer are generally known to one having skill in the art and will apply to the present disclosure.

In the present example, when the dielectric seal device 70 is utilized as part of the VAFN assembly 44, the resilient first element 74 is in the expanded state 84 (i.e., with its electrodes de-energized, substantially-natural state) when the VAFN assembly 44 is in the stowed state 58. Also, when the VAFN assembly 44 is in the stowed state 58 and the resilient first element 74 is in the de-energized expanded state 84, the resilient second element 78 is in biased contact with the surface 64 of the translating fan nozzle 46, thus placing the resilient second element 78 in a compressed mode 86 (see FIG. 6) thus effectively blocking air gap 68 (see FIG. 5). In preparation of moving the nozzle assembly from its stowed state 58 and toward its deployed state 60, the controller 80 may first energize the electrodes 72, 76, thus placing the resilient first element in the contracted state 82 which moves the second element out of the compressed mode 86 and into an extended mode 88. With the resilient first element 74 in the contracted state 82, the second element in the extended mode 88, and a gap 90 thus existing between the resilient second element 78 and the surface 64, the translating fan nozzle 46 may begin moving away from the fixed structure 45 and toward the deployed state 60 (see FIG. 6). That is, the surfaces 62, 64, with respect to one-another, move from the closed ("stowed") position 66 (see FIG. 3) to the distant ("deployed") position 68 (see FIG. 5).

When the VAFN assembly 44 is in the deployed state 60 and a portion of the bypass airflow 38 is flowing through the upstream exit area 56, the first and second electrodes 72, 76 may remain energized, and the resilient first element 74 of the seal device 70 may remain in the contracted state 82 to minimize or eliminate any undesirable airflow obstruction that may otherwise be caused by the seal device 70. When the VAFN assembly 44 moves from the deployed state 60 and toward the stowed state 58, the first and second electrodes 72, 76 may remain energized, and the resilient first element 74 may remain in the contracted state 82. When the VAFN assembly 44 fully reaches the stowed state 58 and without any contact between surfaces 62, 64 (and without any seal wear), the controller 80 may de-energize the electrodes 72, 76 and the resilient first element 74 may extend into the expanded (i.e., "neutral") state 84, thus moving the second resilient element 78 into the compressed mode 86 (i.e., making sealing contact with the surface 64). It is further contemplated and understood that the surface positions 66, 68, the first element states 82, 84 and the second element modes 86, 88 all associated with the energizing of electrodes may occur in any variety of order and/or sequence depending upon a particular application.

Benefits of employing the dielectric seal device 70 of the present disclosure includes an actively shape-changing seal that avoids scrubbing action between surfaces to be sealed. More specifically, the term 'scrubbing' refers to the undesired action of two sealing surfaces that slide across a seal during seal engagement. Undesired scrubbing may abrade and wear down the more traditional seals over a period of time, may cause the seal to tear, and/or may create stresses in the flexible material of the seal and therefore subjects the seal to fatigue failures. The scrubbing action may pull more traditional seals in one direction during closure, and then in another direction during opening. The dielectric seal device 70 of the present disclosure avoids scrubbing because of the changing shape of the seal device which causes disengagement before sealing surface movement. Other applications of the dielectric seal device 70 include any two surfaces requiring a seal there-between and that, when in motion with respect to one-another, may cause an undesired scrubbing action.

Figure 8:
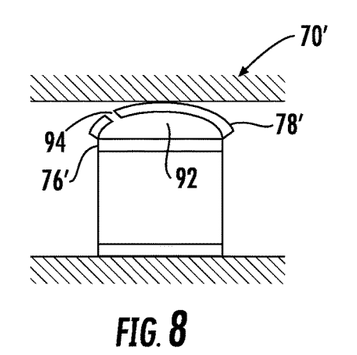
FIG. 8 is a cross section of a second embodiment of a dielectric seal device.

Referring to FIG. 8, a second embodiment of a dielectric seal device is illustrated wherein like elements to the first embodiment have like identifying numerals except with the addition of a prime suffix. A dielectric seal device 70' may include a resilient second element 78' that is generally hollow such that a cavity 92 is located between and generally has boundaries defined by the second electrode 76' and the resilient second element 78'. An opening 94 may be located in the resilient second element 78' and may be in fluid communication with the cavity 92 such that air flows through the opening 94 as the resilient second element 78' is compressed and extended. Moreover, the opening 94 may be in communication with a pressure side (e.g. bypass duct), such that the cavity 90 may be pressurized optimizing the sealing capability of the seal device 70'.

Figure 9:
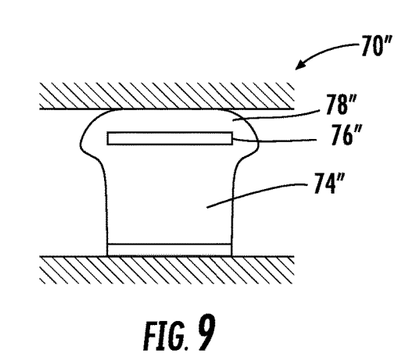
FIG. 9 is a cross section of a third embodiment of a dielectric seal device.

Referring to FIG. 9, a third embodiment of a dielectric seal device is illustrated wherein like elements to the first embodiment have like identifying numerals except with the addition of a double prime suffix. A dielectric seal device 70" may include resilient first and second elements 74", 78" that are one unitary piece with a second electrode 76" embedded in the first and second elements.

Figure 10:
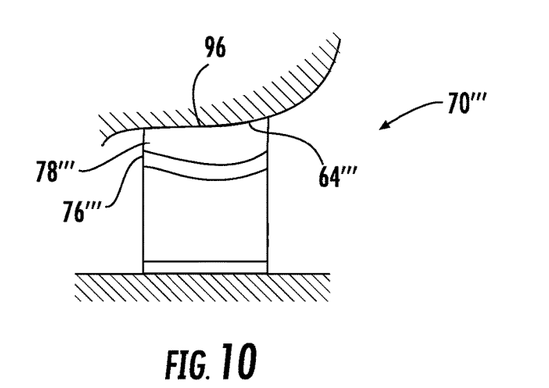
FIG. 10 is a cross section of a fourth embodiment of a dielectric seal device.

Referring to FIG. 10, a fourth embodiment of a dielectric seal device is illustrated wherein like elements to the first embodiment have like identifying numerals except with the addition of a triple prime suffix. A dielectric seal device 70''' may include a resilient second element 78''' that includes a contoured face 96 that mirrors and generally mates to the contours of an opposing surface 64". A second electrode 76''' may be contoured to generally match the contoured face 96.

While the present disclosure is described with reference to exemplary embodiments, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

We claim:

1. A dielectric seal device positioned between first and second surfaces configured to move between close and distant positions, the dielectric seal device comprising:
    a first electrode engaged to the first surface;
    a second electrode spaced between the first and second surfaces and spaced from the first electrode;
    a resilient first element disposed between and engaged to the first and second electrodes, and configured to move between contracted and expanded states when the first and second electrodes are energized, wherein energizing of the first and second electrodes facilitate the movement between contracted and expanded states; and
    a resilient second element opposing the second surface and engaged to the second electrode, and configured to move between a compressed mode when the first and second surfaces are in the close position and an extended mode when the first and second surfaces are in the distant position, wherein the resilient first and second elements are one unitary piece and the second electrode is completely embedded in the one unitary piece.

2. The dielectric seal device set forth in claim 1, wherein the first surface is stationary.

3. The dielectric seal device set forth in claim 1, wherein the first element is configured to be in the contracted state when the first and second electrodes are energized and in the expanded state when the first and second electrodes are de-energized.

4. A dielectric seal device positioned between first and second surfaces configured to move between close and distant positions, the dielectric seal device comprising:
    a first electrode engaged to the first surface;
    a second electrode spaced between the first and second surfaces and spaced from the first electrode;
    a resilient first element disposed between and engaged to the first and second electrodes, and configured to move between contracted and expanded states when the first and second electrodes are energized; and
    a resilient second element opposing the second surface and engaged to the second electrode, and configured to move between a compressed mode when the first and second surfaces are in the close position and an extended mode when the first and second surfaces are in the distant position, wherein the resilient first element is configured to be in the contracted state when the first and second electrodes are energized and in the expanded state when the first and second electrodes are de-energized, and wherein the resilient second element is in the compressed mode when the resilient first element is in the expanded state.

5. The dielectric seal device set forth in claim 4, wherein the second element is in the extended mode when the first element is in the contracted state.

6. The dielectric seal device set forth in claim 1 further comprising:
    a controller configured to energize the first and second electrodes when the first and second surfaces are in the distant position and de-energize the first and second electrodes when the first and second surfaces are in the close position.

7. The dielectric seal device set forth in claim 1, wherein the second element is in contact with the second surface when the first and second surfaces are in the close position and the first element is in the extended state.

8. The dielectric seal device set forth in claim 1, wherein a cavity is defined by the second element and the second electrode.

9. A dielectric seal device positioned between first and second surfaces configured to move between close and distant positions, the dielectric seal device comprising:
    a first electrode engaged to the first surface;
    a second electrode spaced between the first and second surfaces and spaced from the first electrode;
    a resilient first element disposed between and engaged to the first and second electrodes, and configured to move between contracted and expanded states when the first and second electrodes are energized; and
    a resilient second element opposing the second surface and engaged to the second electrode, and configured to move between a compressed mode when the first and second surfaces are in the close position and an extended mode when the first and second surfaces are in the distant position, wherein a cavity is defined by the resilient second element and the second electrode, and wherein an opening in the resilient second element is in fluid communication with the cavity.

10. The dielectric seal device set forth in claim 1, wherein the second element includes a contoured face that opposes and mirrors the second surface which is contoured.

11. The dielectric seal device set forth in claim 10, wherein the second electrode is contoured to generally match the contoured face.

12. The dielectric seal device set forth in claim 1, wherein the dielectric seal device is part of a nacelle of a turbofan engine.

\* \* \* \* \*